United States Patent [19]
Hanak et al.

[11] 3,897,628
[45] Aug. 5, 1975

[54] METHOD OF FORMING A THIN PIEZOELECTRIC BODY METALLICALLY BONDED TO A PROPAGATION MEDIUM CRYSTAL

[75] Inventors: Joseph J. Hanak, Trenton, N.J.; David Michael Stevenson, Topsfield, Mass.

[73] Assignee: RCA Corporation, New York, N.Y.

[22] Filed: Nov. 19, 1973

[21] Appl. No.: 417,386

[52] U.S. Cl. .................... 29/580; 29/590; 29/25.35
[51] Int. Cl.[2] ........................................ B01J 17/00
[58] Field of Search ....... 29/576 J, 576 B, 580, 583, 29/590, 25.35

[56] References Cited

UNITED STATES PATENTS 3,333,324 8/1967 Roswell ............................ 29/576 J
3,355,568 11/1967 Hirai ................................ 29/576 B
3,820,236 6/1974 Haitz.................................... 29/580

*Primary Examiner*—W. Tupman
*Attorney, Agent, or Firm*—G. H. Bruestle; D. S. Cohen; C. L. Silverman

[57] ABSTRACT

One surface of a piezoelectric body is polished free of surface defects. A metallic film is deposited on the damage free surface of the piezoelectric body and on one surface of a propagation medium crystal. The film surfaces of the piezoelectric body and the propagation medium crystal are bonded together. The piezoelectric body is thinned to final thickness by ion beam milling.

7 Claims, 2 Drawing Figures

METHOD OF FORMING A THIN PIEZOELECTRIC BODY METALLICALLY BONDED TO A PROPAGATION MEDIUM CRYSTAL

BACKGROUND OF THE INVENTION

This invention relates to a method of forming a thin body of single crystalline material bonded to a substrate, and particularly to such a method wherein the thinned body retains the bulk properties of the single crystalline material.

Thin single crystalline bodies have been formed on a substrate by thinning a body of single crystalline material, bonding the thinned body to a substrate and then further thinning the body in its bonded position. Thinning has included lapping with abrasive powder, diamond polishing and, more recently, ion beam milling.

Although this method is quite satisfactory for forming most thin bodies of single crystalline material, it has been found to have a disadvantage when the thin body formed is required to be less than several microns thick and still retain the bulk properties of the single crystalline material. In this method, when the thin body is formed, scratches and defects caused by polishing and thinning, are often of the same magnitude as the final thickness desired. The scratches and defects tend to cause the thin body to lose the bulk properties of the material from which it was thinned.

The method of forming a thin body on a substrate is often applied to fabricating ultrasonic transducers for converting alternating electric fields, such as microwave signals, into ultrasonic sound signals having the same frequency as that of the applied field. Typically, such a device consists of a crystal wafer of a piezoelectric material sandwiched between two metal electrodes.

There is a strong interest in developing ultrasonic transducers useful in very high frequency ranges, e.g., 2–20 GHz. However, it is well known that the resonance frequency of an ultrasonic transducer varies inversely with the thickness of the piezoelectric crystal. Therefore, it is necessary to form thin piezoelectric wafers for use in this high frequency range, e.g., a thickness less than 2 microns. One way to obtain thin piezoelectric layers has been evaporation or sputtering of such materials as CdS and ZnO. Although such layers are polycrystalline, they have sufficiently good preferred crystalline orientation to give satisfactory coupling coefficients. Nevertheless, satisfactory performance has been achieved only in layers of several microns as good preferred orientations develop in deposited layers only after several tenths of microns. Present methods cannot produce a piezoelectric wafer suitable for high frequency operation without causing defects which would make operation impractical. It would therefore be desirable to develop a method for forming a thin piezoelectric body on a propagation medium crystal where the thin body maintains the bulk properties of the piezoelectric material.

SUMMARY OF THE INVENTION

A method of forming a thin body of single crystalline material bonded to a substrate while retaining the bulk properties of the single crystalline material. One of the surfaces of the single crystalline material is polished free of defects. The polished surface is then bonded to a substrate. The bonded single crystalline body is then thinned through ion beam milling.

DETAILED DESCRIPTION

Figure 2:
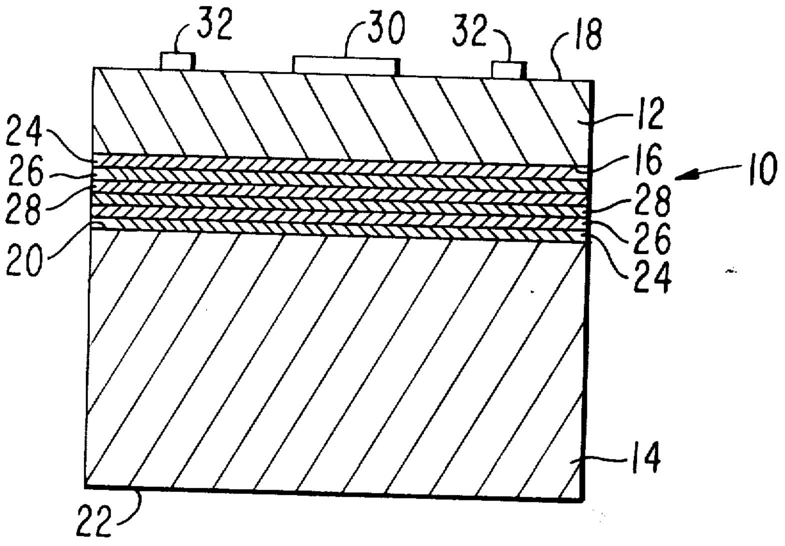
FIG. 2 is a cross-sectional view of a device made by the method of the present invention.

Referring initially to FIG. 2, a form of an ultrasonic microwave delay line made by the method of the present invention is generally designated as 10. The delay line 10 comprises piezoelectric body 12 metallically bonded to propagation medium crystal 14. The method of the present invention permits the utilization of the optimum combination of piezoelectric body 12 and propagation medium 14. For example, shear wave generating X cut lithium niobate can be chosen for piezoelectric body 12 and magnesium aluminate spinel can be chosen for propagation medium 14 so as to take advantage of the high coupling coefficient of lithium niobate and the low loss acoustic mode for shear waves propagating in the <100> direction in magnesium aluminate spinel. The extreme thinness required for high frequency operation, e.g., 0.24$\mu$m for lithium niobate at 10 GHz, cannot be achieved by conventional methods while still retaining the bulk properties of lithium niobate.

Prior to processing, piezoelectric body 12 is about 250 microns thick and about 5mm × 5mm in area. Bottom surface 16 and top surface 18 of piezoelectric body 12 are lapped parallel in water on a glass surface with abrasive particles averaging about 9 microns in diameter such as the particles of aluminum oxide available in American Optical Abrasive No. 305. Bottom surface 16 of piezoelectric body 12 is diamond polished flat, using consecutive abrasive particles sizes of 6$\mu$, 3$\mu$ and 0.5$\mu$ in water on a block tin lap until the distance between top surface 18 and bottom surface 16 of piezoelectric body 12 is approximately 175$\mu$m. At this point, piezoelectric body 12 is still too thick to be utilized as a transducer device for operation over 1 GHz. Any further mechanical polishing will create surface damage which could be of the same magnitude as the final thickness required for piezoelectric body 12.

Figure 1:
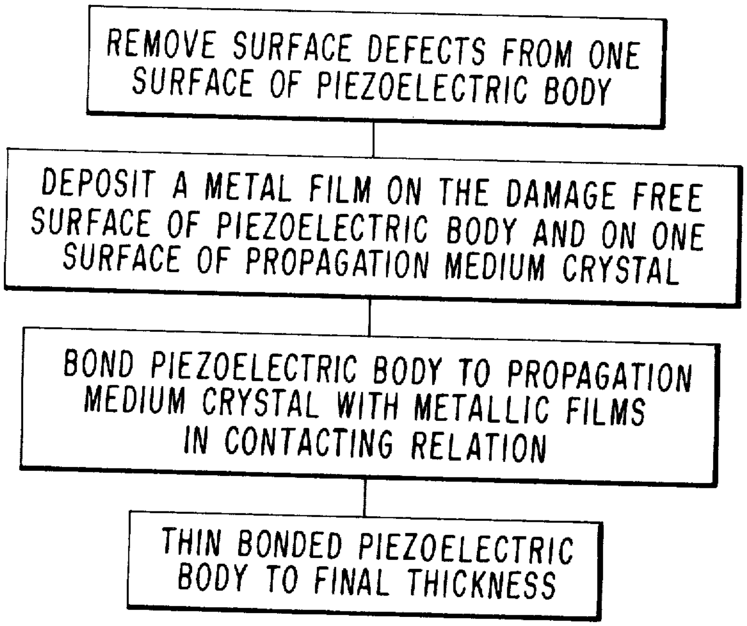
FIG. 1 is a flow chart showing the steps of the method of the present invention.

The method of the present invention removes substantially all surface defects from bottom surface 16 of piezoelectric body 12 as shown in the flow chart of FIG. 1. A chemical-mechanical technique is employed. Specifically, the technique comprises impregnating a polishing cloth with precipitated colloidal silica slurried in water with pH adjusted to approximately 11 with NaOH. Colloidal silica is produced by the Philadelphia Quartz Company and Monsanto Chemical Company and is commercially available under the respective trade names, QUSO and Syton. The impregnated polishing cloth is then brought into contact with bottom surface 16 of piezoelectric body 12 thereby bringing the colloidal particles into chemical contact with bottom surface 16 of piezoelectric body 12. The impregnated polishing cloth is slid or rubbed over bottom surface 16 of piezoelectric body 12 using any conventional polishing equipment, e.g., rotary polishing apparatus. Polishing with the impregnated cloth removes only a few microns of the piezoelectric material, leaving bottom surface 16 of piezoelectric body 12 substantially free of surface damage.

Prior to processing, propagation medium spinel 14 is approximately 9mm thick and 5mm × 5mm in area. Spinel crystal 14 is cut with the <100> axis normal to its top surface 20. The top surface 20 and bottom surface 22 of medium 14 are lapped and polished flat and parallel using abrasive powder, such as American Optical Abrasive No. 305, in water on a glass surface, to a desired thickness, e.g., 6mm. Preferably, for high frequency operation, e.g., 10 GHz, where piezoelectric body 12 of submicron thickness is required (0.24$\mu$m for lithium niobate), top surface 20 of medium 14 would also be polished by the chemical-mechanical method previously mentioned.

Piezoelectric body 12 and propagation medium 14 are then cleaned by conventional techniques such as water, isopropyl alcohol vapor, ultrasonics, etc., to remove dust and foreign adherents. Metal films are then applied to bottom surface 16 of piezoelectric body 12 and top surface 20 of medium 14 as in FIG. 1. The metal film is subsequently employed to provide a bond between piezoelectric body 12 and medium 14 which is mechanically strong and capable of transmitting high frequency oscillations with minimal attenuation. For example, a first layer of chromium 24 (200 to 300A.) is applied, e.g., by the well known method of evaporation in a vacuum, on bottom surface 16 of piezoelectric body 12 and on top surface 20 of medium 14. A metal such as chromium is chosen for the first layer as chromium adheres well to piezoelectric body 12 and medium 14. A layer of gold 26 (1000 to 2000A.) is then deposited by evaporation on the chromium layer of each of the body 12 and medium 14. For the evaporation of chromium layer 24 and gold layer 26, piezoelectric body 12 and medium 14 should be heated to 350°C for better adherence. A final layer 28 of indium (1000 to 2000A.) is then evaporated on gold layer 26 of each of the body 12 and medium 14. For higher frequency, e.g., 10 GHz, gold or aluminum would be preferred over indium as a bonding material as indium has a high acoustic attenuation and is a poor acoustic match to spinel and lithium niobate. It is important to note that if indium is employed as the bonding layer, care should be taken to evaporate the indium onto gold layer 26 on each of the body 12 and medium 14 in the same vacuum where bonding is to take place so as not to oxidize the indium.

Without breaking the vacuum achieved for depositing indium, piezoelectric body 12 and medium 14 are placed with indium layers 28 in good contacting relation and a pressure is applied to the body 12 and medium 14 sufficient to fuse the indium layers 28 together as in FIG. 1. For a good indium to indium bond, a pressure range of 15 to 30 atmospheres at room temperature would be successful. Any well known pressure bonding apparatus will be successful although it is essential that the apparatus is capable of achieving the required pressure and vacuum as well as insuring that piezoelectric body 12 and medium 14 line up and meet with bottom surface 16 of piezoelectric body 12 substantially parallel to top surface 20 of medium 14.

After bonding, piezoelectric body 12 is ready for final thinning as in FIG. 1. Top surface 18 of piezoelectric body 12 is mechanically lapped with abrasive powder, such as American Optical Abrasive No. 305, in substantially the same manner as bottom surface 16 was lapped, until the thickness of the piezoelectric body 12 is reduced from 175$\mu$m to approximately 75$\mu$m. Top surface 18 of piezoelectric body 12 is then diamond polished using consecutive abrasive particle sizes of 6$\mu$, 3$\mu$ and 0.5$\mu$ until the distance between top surface 18 and bottom surface 16 of piezoelectric body 12 is as little as 7 microns. Further chemical or mechanical thinning below this thickness tends to destroy the piezoelectric body 12 by cracking and peeling.

Final polishing of piezoelectric body 12 to desired thickness while retaining bulk properties, as in FIG. 1, utilizes an ion beam milling method known in the art, similar to one described by E. G. Spencer and P. H. Schmidt in their article entitled, "Ion Beam Techniques for Device Fabrication," J. Vac. Sci. Tech., Vol. 8, No. 5, October 1971, pp. S52–S70. The method consists of employing an argon ion beam, accelerated to several thousand volts, to impinge onto top surface 18 of piezoelectric body 12 at an oblique angle of incidence so as to remove atoms from top surface 18 of piezoelectric body 12 via sputtering at a steady controlled rate. For example, a beam of 1.3 cm in diameter, an accelerating dc voltage of 6000 to 7000V and a beam current range of 40 to 120 mA could be successfully utilized for ion beam milling although wider beams will yield better thickness uniformity.

When the ion density of the beam is not uniform throughout its diameter, the thinning is correspondingly nonuniform. Typically, the rate of removal near the edges of top surface 18 of piezoelectric body 12 is about 25 percent less than near the center of top surface 18. Nevertheless, sufficiently large flat areas can be obtained to evaporate gold dot electrode 30 near the center of top surface 18 of piezoelectric body 12. A capacitive power coupling can be utilized by evaporating a second ring shaped gold electrode 32 concentrically with gold dot electrode 30.

Although the method of the present invention has been described for forming a submicron piezoelectric body metallically bonded to a propagation medium crystal, it can also be used to form a thin body of single crystalline material bonded to a substrate where the thin body is required to retain the bulk properties of the single crystalline material.

We claim:

1. A method of forming a thin body of piezoelectric material bonded to a propagation medium crystal while maintaining the bulk properties of said piezoelectric material comprising the steps of:

a. providing a body of piezoelectric material, said body having surface defects in at least one surface,
b. polishing said one surface of said piezoelectric body until substantially all surface defects are removed,
c. depositing a metallic film on said polished surface of said piezoelectric body and on one surface of said propagation medium crystal, then
d. bonding said metallized surface of said piezoelectric body to said metallized surface of said propagation medium crystal, and then
e. thinning said piezoelectric body, said thinning including ion beam milling.

2. The method of claim 1 wherein said polishing includes bringing said surface of said piezoelectric body into contact with precipitated colloidal silica slurried in water in an alkaline solution, wherein said colloidal silica is slid over said surface of said piezoelectric body.

3. The method of claim 2 wherein prior to said polishing in said solution, said surface of said body is lapped with abrasive powder and then diamond polished with consecutively smaller sized abrasive particles.

4. The method of claim 3 wherein prior to said ion beam milling, said piezoelectric body is thinned by lapping with abrasive powder and then diamond polished with consecutively smaller sized abrasive particles.

5. The method of claim 4 wherein said piezoelectric body is thinned to a thickness no less than 0.1 microns.

6. A method of forming a thin body of single crystalline material bonded to a substrate while retaining the bulk properties of said material comprising the steps of:

a. polishing one of the surfaces of said body to remove surface defects in which said polishing includes bringing said surface of said body into contact with precipitated colloidal silica slurried in water in an alkaline solution, wherein said colloidal silica is slid over said surface of said body, then b. bonding said polished surface of said body to said substrate, and then c. thinning said body, said thinning including ion beam milling.

7. The method of claim 6 wherein prior to polishing in said solution, said surface of said body is lapped with abrasive powder and then diamond polished with consecutively smaller sized abrasive particles.

* * * * *